United States Patent [19]
Fujii

[11] Patent Number: 5,148,400
[45] Date of Patent: Sep. 15, 1992

[54] SEMICONDUCTOR MEMORY CIRCUIT HAVING AN IMPROVED RESTORING CONTROL CIRCUIT

[75] Inventor: Takeo Fujii, Tokyo, Japan
[73] Assignee: NEC Corporation, Tokyo, Japan
[21] Appl. No.: 644,865
[22] Filed: Jan. 23, 1991

Related U.S. Application Data
[63] Continuation of Ser. No. 451,688, Dec. 18, 1989, abandoned.

Foreign Application Priority Data
Dec. 16, 1988 [JP] Japan .................................. 63-317827

[51] Int. Cl.$^5$ .............................................. G11C 11/40
[52] U.S. Cl. ............................... 365/222; 365/189.01
[58] Field of Search ............... 365/222, 189.01, 189.05

[56] References Cited
U.S. PATENT DOCUMENTS
3,737,879  6/1973  Greene et al. ...................... 365/222

Primary Examiner—Terrell W. Fears
Attorney, Agent, or Firm—Sughrue, Mion, Zinn, Macpeak & Seas

[57] ABSTRACT

A dynamic memory circuit which can operate with a reduced amount of current noise and without destruction of stored data. The memory circuit includes dynamic memory cells necessitating restoring operation, a read circuit for performing a read-out operation in an active state and a restore circuit for performing a restore operation in a reset state following the active state.

8 Claims, 8 Drawing Sheets

SEMICONDUCTOR MEMORY CIRCUIT HAVING AN IMPROVED RESTORING CONTROL CIRCUIT

This is a continuation of application Ser. No. 07/451,688 filed Dec. 18, 1989 now abandoned.

BACKGROUND OF THE INVENTION

1. Field of the Invention

The present invention relates to a semiconductor memory circuit and, more particularly, to a dynamic type random access memory (DRAM) fabricated on a semiconductor substrate.

2. Description of the Related Art

Dynamic memory circuits have been widely utilized as large capacity semiconductor memories in various fields. The dynamic memory circuit is generally constructed in such a manner that one-transistor type memory cells are arranged in a matrix form of rows and columns together with word lines and bit lines arranged in rows and columns, respectively.

According to the conventional technique, the number of memory cells connected to one bit line increases as the memory capacity increases. Consequently, a stray capacitance of each bit line increases to cause various problems. First, when the sense amplifiers are activated, the bit lines need to be charged or discharged to a power supply potential Vcc or a ground potential Vss. In this regard, the increase in the stray capacitances of the bit lines cause an increase in the time required for charging and discharging. If the respective pairs of bit lines are not sufficiently amplified, that is, if charging or discharging is not sufficiently effected, it is impossible to enable a column selection circuit so as to connect the selected pair of bit lines to a pair of common data lines. This is because, when the common data lines are connected to bit lines, the charges on the common data lines may flow into the bit lines to destroy the stored information. As a consequence, the time at which the data is output from an output terminal is delayed, which results in a lower operation speed. Secondly, the increase in the bit line stray capacitances causes an increase in the charging and discharging current during an active period, thus causing problems, for example, floating of the ground potential at an internal ground wiring, a lowering in the power supply potential, and generation of noise between the bit lines. Particularly, the floating of the ground potential during the active period causes noise due to operations of peripheral circuits such as an output circuit, the column selection circuit, and a potential of the non-selected word lines undesirably exceeds a threshold voltage of memory cell transistors or more, storage capacitors of the non-selected memory cells are erroneously connected to the bit lines, resulting in destruction of the stored data.

SUMMARY OF THE INVENTION

It is an object of the present invention to provide a semiconductor memory circuit which can operate at a high speed.

It is another object of the present invention to provide a dynamic memory circuit which can stably operate without data destruction.

The dynamic memory according to the present invention comprises means for receiving an external control signal having a first level which sets the memory in an active state and a second level which sets the memory in a reset state and dynamic memory cells which require restoring read-out data therein and, is featured in that read-out of data from a memory cell or cells is performed in the active state and restoring of data to the memory cell or cells is conducted in the reset state.

According to a preferred aspect of the present invention, a time required for the restoring of data to the memory cells is removed in the active state can be shortened and a current amount required in the active state is reduced.

Moreover, bit lines are not charged or discharged in the active state but left near a precharged level with small signal difference, memory cell transistors of the memory cells coupled to the non-selected word lines are never turned conductive even when the potential of the non-selected word lines float in levels. Thus, destruction of data stored in the non-selected memory cells can be effectively prevented.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE PREFERRED EMBODIMENTS

Figure 1:
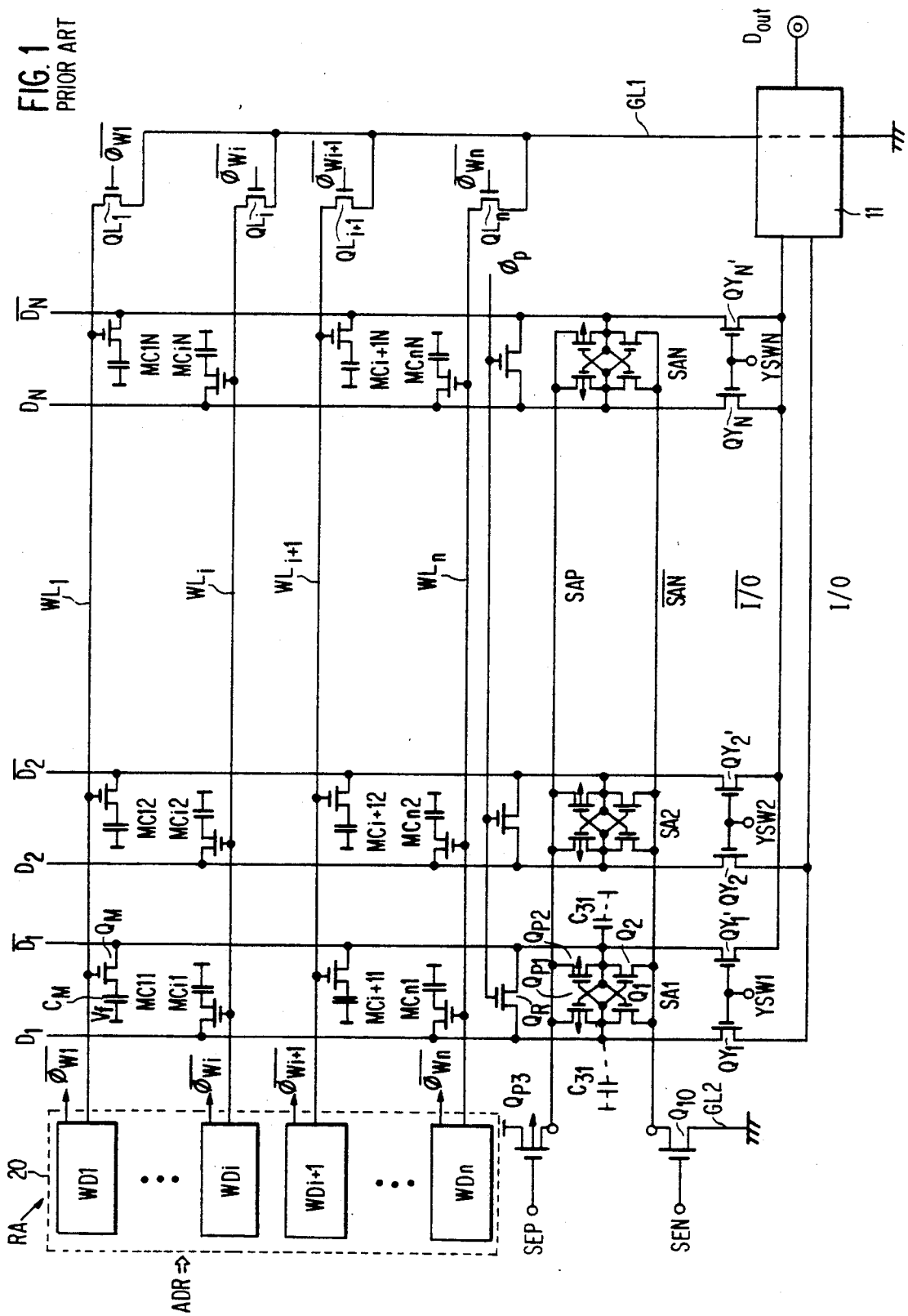
FIG. 1 is a schematic circuit diagram showing a dynamic memory in the prior art.
Figure 2:
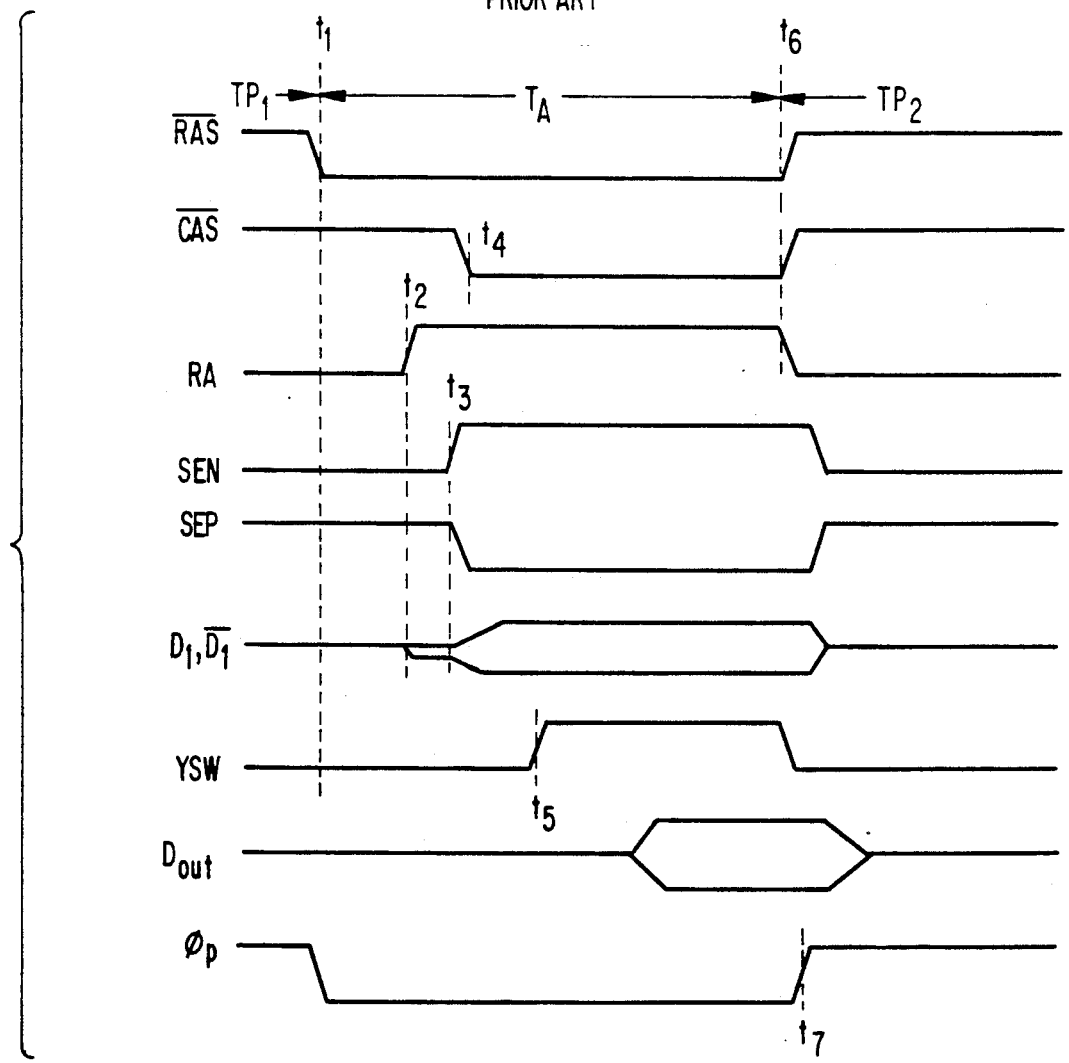
FIG. 2 is a timing diagram showing an operation of the memory of FIG. 1.

With reference to FIGS. 1 and 2, a typical structure of the conventional dynamic memory will be explained.

As shown in FIG. 1, the memory comprises a plurality of one-transistor type memory cells $MC_{11}$-$MC_{nN}$ each having a memory cell transistor $Q_M$ and a storage capacitor $C_M$ connected between the transistor $Q_M$ and a fixed potential $V_f$, word lines $WL_1$-$WL_n$ arranged in rows, a plurality of bit line pairs $D_1$, $\overline{D_1}$-$D_N$, $\overline{D_N}$ arranged in columns, CMOS type sense amplifiers $SA_1$-$SA_N$ provided for the bit line pairs $D_1$, $\overline{D_1}$-$D_N$, $\overline{D_N}$, respectively, a pair of common data lines I/O, $\overline{I/}$ , a plurality of pairs of column selection transistors $QY_1$, $QY_1'$-$QY_N$, $QY_N$ connected between the bit line pairs and the pair of common data lines, respectively, a row decoder 20 having decoding units $WD_1$-$WD_n$ for selecting the word lines $WL_1$-$WL_n$, and an output circuit 11.

The row decoder 20 operatively selects one of the word lines $WL_1$-$WL_n$ in accordance with row address signals ADR in response to a timing signal RA. Each of the sense amplifiers $SA_1$-$SA_N$ includes P-channel MOS transistors QP1, QP2 and N-channel MOS transistors $Q_1$, $Q_2$ connected to a first activation line SAP and a second activation line $\overline{SAN}$. The activation line SAP is connected to a P-channel MOS transistor QP$_3$ controlled by a control signal SEP and the activation line $\overline{SAN}$ is coupled to an N-channel MOS transistor Q$_{10}$ controlled by a control signal SEN. The pairs of column selection transistors QY$_1$, QY$_1'$-QY$_N$, QY$_N'$ are controlled by column decoder signals YSW$_1$-YSW$_N$ generated by a column decoder (not shown) in a known way.

The row decoder 20 also generates clamp signals $\overline{\phi}_{w1}$-$\overline{\phi}_{wn}$ which are opposite to those outputs for the word lines WL$_1$-WL$_n$, respectively. For example, when the word line WL$_1$ is selected (high level), the signals $\overline{\phi}_{w2}$-$\overline{\phi}_{wn}$ are high in level with $\overline{\phi}_{w1}$ at a low level. Clamp transistors of N-channel type QL$_1$-QL$_n$ are connected between the word lines WL$_1$-WL$_n$ and a ground wiring GL$_1$ which is extending through the output circuit 11 and connected to the output circuit 11. The clamp transistors QL$_1$-QL$_n$ receive the clamp signals $\overline{\phi}_{w1}$-$\overline{\phi}_{wn}$, respectively. The source of the transistor Q$_{10}$ is connected to a separate ground wiring GL$_2$.

With reference to FIG. 2, a typical operation of the memory of FIG. 1 will be explained.

During a reset period TP$_1$ before the starting (T$_1$) of the active operation period (T$_A$), the bit lines $\overline{D}_1$, D$_1$ to D$_N$, $\overline{D}_N$ have been maintained at, for example, an intermediate potential ($\frac{1}{2}$ Vcc) of a power supply potential Vcc and a ground potential Vss. When the row address strobe signal $\overline{RAS}$ becomes an active, low level at t$_1$, the active period T$_A$ is initiated and one word line driving circuit, for example, WDi, is selected among the word line driving circuits WD$_1$ to WD$_n$ on the basis of row address signal ADR given externally in response to RA which is an internal signal formed from $\overline{RAS}$ at t$_2$, so that one selected word line e.g. WLi rises in potential. As a consequence, the memory cell transistors Q$_M$ of the memory cells MCi1 to MCiN turn ON, so that the potentials of one bit lines of the bit line pairs $\overline{D}_1$, D$_1$ to $\overline{D}_N$, change in the range of from about 100 mV to 200 mV in accordance with charges stored in the respective storage capacitors C$_M$. On the other hand, the potentials of the other bit lines remain at the initial value, that is, the potential of $\frac{1}{2}$ Vcc. Accordingly, the signals representative of the potential differences are input to the sense amplifiers SA$_1$ to SA$_N$, respectively. Next, when the sense amplifier enabling signal SEN rises and SEP falls at t$_3$, the sense amplifiers SA$_1$ to SA$_N$ are activated to amplify the very small difference signals input to the sense amplifiers. As a result, for example, the bit line D$_1$ lowers to the ground potential, while the bit line $\overline{D}_1$ rises to the power supply potential Vcc (in the case where the memory cell MCi1 has "0" information (L) stored therein). In actual fact, the information in the capacitor C$_M$ of the memory cell MCi1 is destroyed through the exchange of charges with the bit line D$_1$ when the word line WLi rises to read out information to the bit line D$_1$. Therefore, the above-described sense amplifier operation serves not only to amplify the very small signals on the bit lines D$_1$ and $\overline{D}_1$ but also to rewrite (i.e., refresh) the destroyed information to the memory cell by reading out the signals to the bit lines. Thereafter, the column decoder signal YSW, which is an internal signal generated from a column address strobe $\overline{CAS}$ on the basis of column address signals (not shown) given to an external address terminal in response to the fall of the column address strobe $\overline{CAS}$, rises, so that, for example, YSW$_1$ is selected and rises at t$_5$. As a result, the data from the bit line pair D$_1$ and $\overline{D}_1$ is transferred to the common data line pair I/O and $\overline{I/}$.

The transferred data is amplified by the output circuit 11 and output to the outside from the output terminal Dout. Then, the active period T$_A$ is terminated at t$_6$ and the reset signal $\phi_p$ rises at t$_7$.

In the above-described prior art, as the storage capacity increases, the number of memory cells connected to each bit line increases and consequently the stray capacitances C$_{31}$ of the bit lines increase, thus causing various problems. First, when the sense amplifiers are activated as described above, the bit lines D$_1$ to D$_N$ and $\overline{D}_1$ to $\overline{D}_N$ need to be charged or discharged to the power supply potential Vcc or the ground potential Vss; in this regard, the increase in the stray capacitances C$_{31}$ of the bit lines cause an increase in the time required for charging and discharging. If the bit line pairs D$_1$, $\overline{D}_1$ to D$_N$, $\overline{D}_N$ are not sufficiently amplified, that is, if charging or discharging is not sufficiently effected, it is impossible to enable YSW so as to connect bit lines to the common data lines I/O and $\overline{I/}$. This is because, when the common data lines are connected to bit lines, the charges on the common data lines may flow into the bit lines to destroy the information. In consequence, the time at which the data is output from the output terminal Dout is delayed, which results in the performance being deteriorated. Secondly, the increase in the bit line stray capacitances C$_{31}$ invites an increase in the charging and discharging current, thus causing problems, for example, floating of the ground potential, a lowering in the power supply potential, and generation of noise between the bit lines.

Moreover, in the above-described conventional semiconductor memory, either the bit line D$_1$ or $\overline{D}_1$ is discharged to the ground potential during the active period T$_A$ when the row address strobe signal $\overline{RAS}$ is at the low potential. Therefore, if noise is generated in the internal grounding wiring GL$_1$ due to the activation of the output circuit 11 during this period, the potentials of the wiring GL$_1$ and the non-selected word lines, for example, WLi+1, undesirably rises from the ground potential to a potential near the threshold voltage of the memory cell transistors Q$_M$, while the bit line D$_1$ already becomes the ground potential, and if the memory cell MCi+11 has information "1" (H) stored therein, the sub-threshold current of the MOS transistor in the memory cell MCi+11 causes the charge in the capacitor of the memory cell MCi+11 to flow out to the bit line D$_1$, thus causing destruction of the stored information. Since this phenomenon is caused by the sub-threshold current of the MOS transistor in the memory cell, failures are likely to occur frequently due to variations in manufacture, for example, misalignment, variations in the gate length of the gate electrodes, etc. The worst is the case where the row address strobe signal $\overline{RAS}$ is maintained at the low potential for a long period of time and during this period the column address strobe signal $\overline{CAS}$ and the external address signal change at high frequency. Thus, a great deal of time is required for inspection.

With reference to FIGS. 3 to 6, the dynamic memory according to one embodiment of the present invention will be explained. In FIGS. 3 to 6, elements or portions corresponding to those in FIGS. 1 and 2 are denoted by the same or similar references and detailed description therefor will be omitted.

The memory of this embodiment is featured as follows. Namely, a plurality of pairs of transfer gate (N-channel) transistors QT$_1$, $\overline{QT}_1$-QT$_N$, $\overline{QT}_N$ are inserted between the pairs of bit lines D$_1$, $\overline{D}_1$-D$_N$, $\overline{D}_N$ and a plurality of pairs of sense nodes $D_1'$, $\overline{D_1'}$-$D_N'$, $\overline{D_N'}$ of the sense amplifiers $SA_1$-$SA_N$, respectively. The purpose of provision of the transfer gates $Q_{T1}$ to $\overline{Q_{TN}}$ is to cut off the bit line stray capacitances $C_{11}$ from the stray capacitances $C_{11}'$ of the sense nodes $D_1'$ to $\overline{D_N'}$ when the sense amplifiers are activated, thereby increasing the operating speed of the sense amplifiers.

A timing signal generator 30 receives the row address strobe signal $\overline{RAS}$ and generates timing signals $RA'$, $SEP'$, $SEN'$, $TG$ and $\phi_p'$. A column decoder 40 receives column address signals $ADC$ and generates the column decoder signals $YSW_1$-$YSW_N$ under control of $\overline{CAS}$ and $RA'$.

In addition, a restoring or rewriting operation is conducted during a reset period when $\overline{RAS}$ is made inactive under control of $RA'$, $SEP'$, $SEN'$, $TG$ and $\phi_p'$ generated by the timing signal generator 30.

Figure 3:
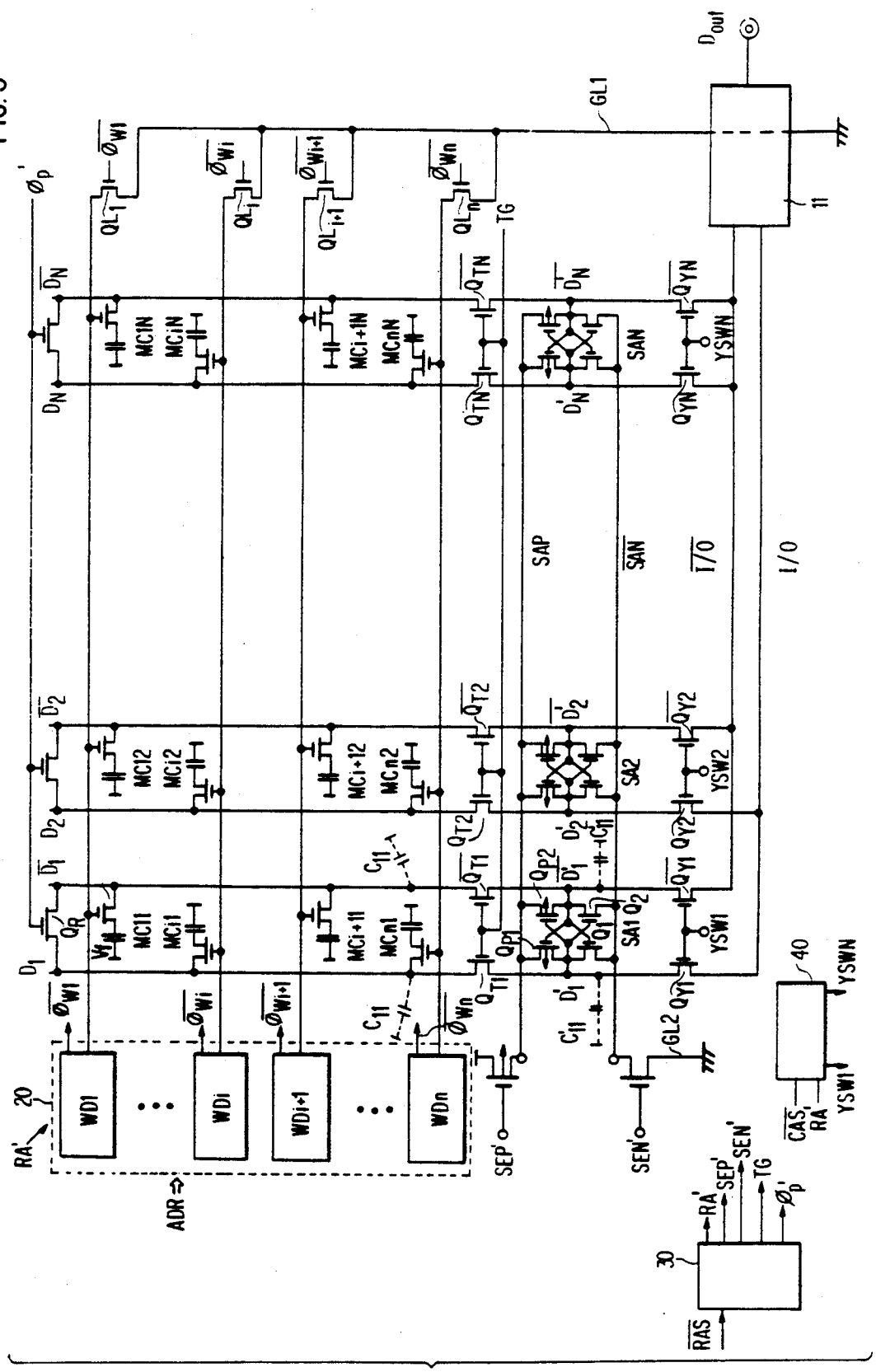
FIG. 3 is a schematic circuit diagram of a dynamic memory according to a first embodiment of the present invention.
Figure 4:
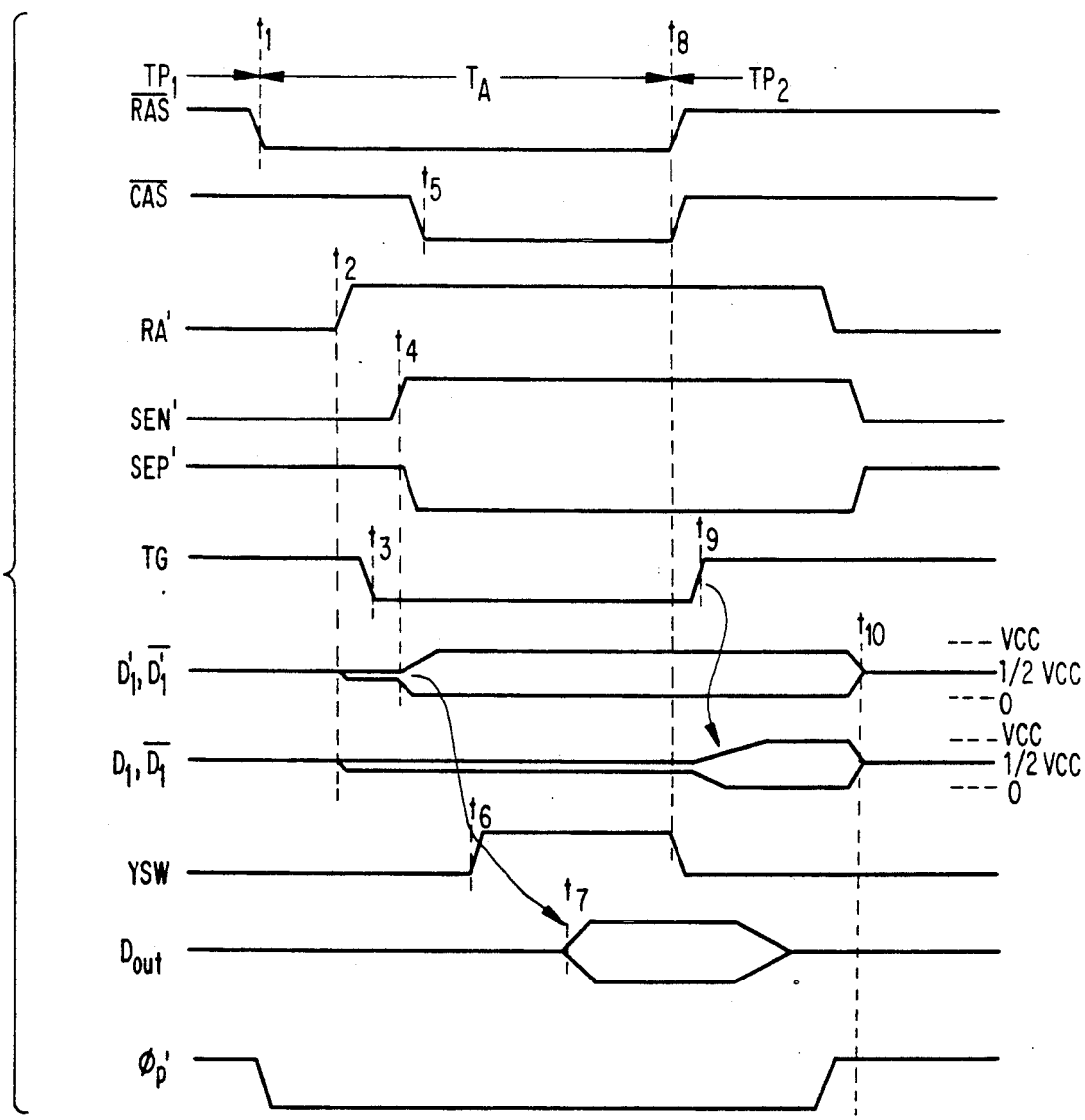
FIG. 4 is a timing diagram showing an operation of the memory of FIG. 3.

The operation of the memory of FIG. 3 will be explained with reference to FIG. 4.

Prior to a time point $t_1$, a reset period $TP_1$ has been set and the pairs of bit lines $D_1$, $D_1$-$\overline{D_N}$, $\overline{N_N}$ and the sense nodes $D_1$, $\overline{D_1'}$-$D_N'$, $\overline{D_N'}$ have been precharged to a precharge potential ($\frac{1}{2}$ Vcc level). At $t_1$, the row address strobe signal $\overline{RAS}$ becomes active (low level) to introduce the active period the row address signals $ADR$ are taken in, and on the basis of the address signals one word line driving unit, for example, $WD_i$, is selected from among the word line driving circuits $WD_1$ to $WD_n$. Thereafter, as the internal signal $RA'$ formed on the basis of $\overline{RAS}$ rises at $t_2$, the potential of the selected word line $WL_i$ rises and consequently information stored in the memory cells $MC_{i1}$ to $MC_{iN}$ connected to the selected word line $WL_i$ appear as very small signals on the bit line pairs $D_1$, $\overline{D_1}$ to $D_N$, $\overline{D_N}$, respectively. Since at this time the transfer gate control signal $TG$ is at the high potential, the signals on the bit line pairs $D_1$, $\overline{D_1}$ to $D_N$, $\overline{D_N}$ are also transferred to the sense nodes $D_1'$, $\overline{D_1'}$ to $D_N'$, $\overline{D_N'}$, respectively. Next, at $t_3$ the control signal $TG$ is lowered to turn OFF the transfer gates $\overline{Q_{T1}}$ to $\overline{Q_{TN}}$, thereby cutting off the bit lines $D_1$ to $\overline{D_N}$ from the sense nodes $D_1'$ to $D_N'$. Thereafter, at $t_4$ the sense amplifier enabling signals $SEN'$ and $SEP'$ are raised and lowered, respectively, to activate the sense amplifiers $SA_1$ to $SA_N$. Since the sense nodes $D_1'$ to $\overline{D_N'}$ have relatively small stray capacitances $C_{11}'$, as described above, they are amplified at high speed. As a result, for example, one sense node $\overline{D_1'}$ reaches the power supply potential Vcc, while the other sense node $D_1'$ reaches the ground potential, rapidly. Thereafter, the column selection transistors, for example, $Q_{Y1}$ and $\overline{Q_{Y1}}$, selected after the column address strobe signal $\overline{CAS}$ becomes active at $t_5$ on the basis of the externally applied column address information $ADC$, are driven to turn ON in response to the rise of the internal signal $YSW$ at $t_6$ generated on the basis of $\overline{CAS}$, so that the data from the sense nodes $D_1'$ to $\overline{D_1'}$ is transferred to the common data line pair $I/O$ and $\overline{I/}$ and output from the output terminal Dout via the output circuit 11. At this point of time, the transfer gate control signal $TG$ remains at the low potential and therefore the bit lines $D_1$ to $\overline{D_N}$ are not charged nor discharged but maintained near the middle potential.

Therefore, it is guaranteed that the potentials of all the bit lines are near the $\frac{1}{2}$ Vcc level and higher than the non-selected word lines even if the potential of the ground wiring $GL_1$ rises to some extent due to the operation of the output circuit 11. Accordingly, the memory cell transistors $Q_M$ of the memory cells coupled to the non-selected word lines are never turned ON.

Thereafter, when $\overline{RAS}$ and $\overline{CAS}$ become inactive at $t_8$ to introduce to a reset period $TP_2$, the internal signal $YSW$ is first lowered to turn OFF the column selections transistors $Q_{Y1}$ and $\overline{Q_{Y1}}$, thereby cutting off the sense nodes $D_1'$ and $\overline{D_1'}$ from the common data line pair $I/O$ and $\overline{I/}$. Thereafter, at $t_9$ the transfer gate control signal $TG$ is raised to start charging and discharging of the bit lines $D_1$ to $\overline{D_N}$ by the sense amplifiers $SA_1$ to $SA_N$ which have been left activated. Thus, one of each bit line pair $D_1$, $\overline{D_1}$ to $D_N$, $\overline{D_N}$ the power supply potential Vcc, while the other reaches the ground potential, performing a restore operation. Thereafter, the word line driving signal $RA'$ is lowered to lower the selected word line $WL_i$. At this point of time, the refreshing of the memory cells $MC_{i1}$ to $MC_{iN}$ is completed. Thereafter, the sense amplifier enabling signals $SEN'$ and $SEP'$ are reset at $t_{10}$ and the bit line sense nodes are also reset, thus completing the operation.

In the foregoing, the arrangement in which N-type MOS transistors are employed as switching elements and CMOS type sense amplifiers are used has been described. However, various changes and modifications may be made to matters of design, for example, the selection of the above-mentioned parts and the set values for the initial and finally reached potentials, of the bit lines according to circumstances. The subject matter of the present application resides in that after the information stored in a memory cell has been transferred to the sense nodes during the active period, the sense nodes and the bit lines are left cut off from each other so as not to carry out charging or discharging of the bit lines. According to the present embodiment, the restoring data to the memory cells is conducted during the reset period after the active period $T_A$, and therefore, the effective length of the active period is shortened as viewed from the outside of the memory, thus, data rate in the access operation can be improved.

Moreover, the memory cell transistors $Q_M$ of the non-selected memory cells are kept non-conductive by performing the restore operation in the reset period, destruction of stored data can be effectively prevented.

An example of the timing signal generator 30 in FIG. 3 will be explained with reference to FIGS. 5 and 6.

Figure 5:
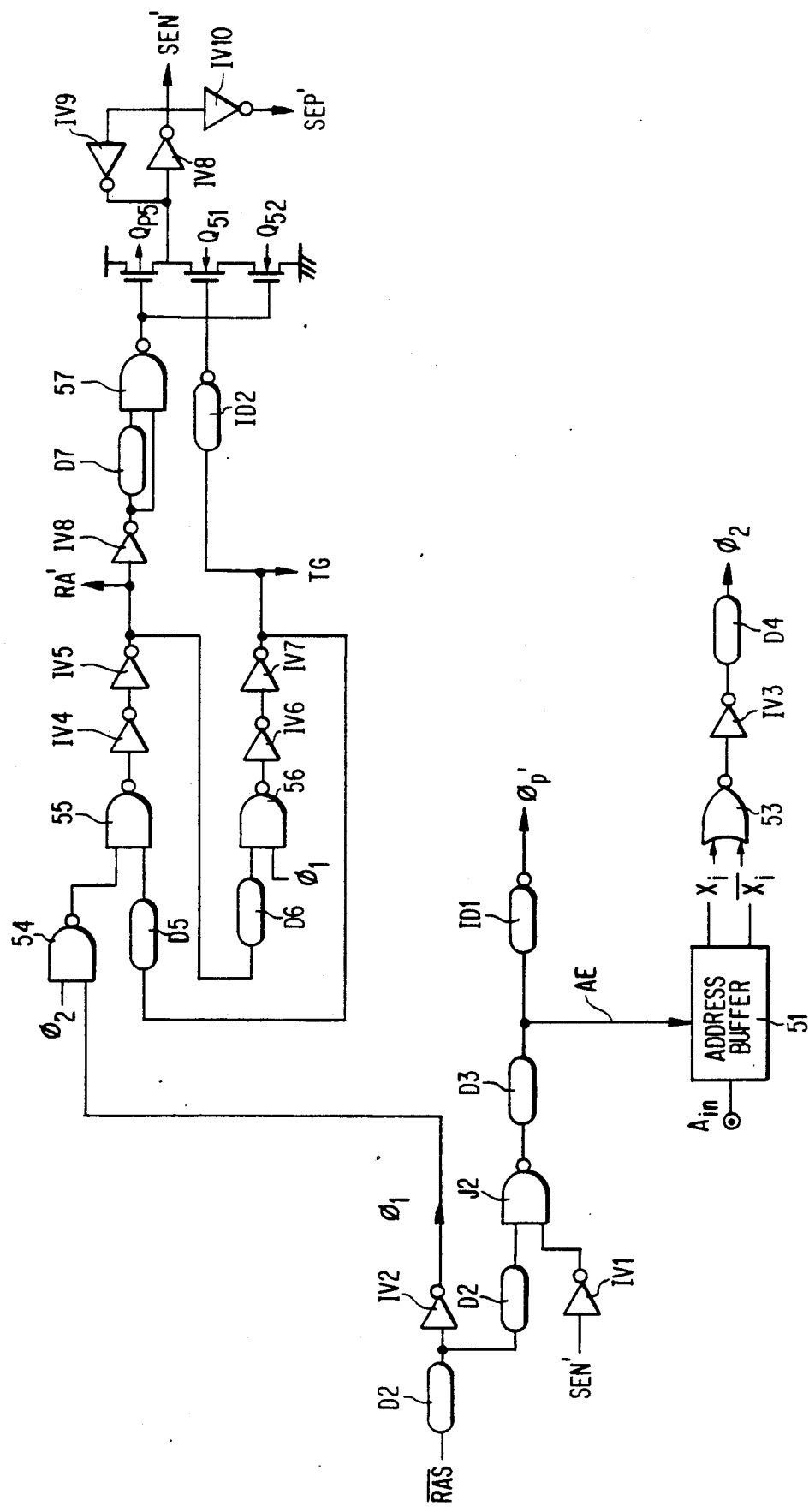
FIG. 5 is a schematic block diagram of a timing signal generator employed in the memory of FIG. 3.

As shown in FIG. 5, the timing signal generator 30 includes delay circuits D1 to D7, inverting delay circuits ID1 and ID2, inverter circuits $IV_1$ to $IV_{10}$, a dummy row address buffer 51, NAND gates 52, 54, 55, 56 and 57, a NOR gate 53, and a series circuit of P-channel MOS transistor $QP_5$ and N-channel MOS transistors $Q_{51}$, $Q_{52}$.

An internal signal $\phi_1$ is generated from $\overline{RAS}$ through the delay circuit D1 and the inverter $IV_2$ and has the substantially opposite phase to $\overline{RAS}$. A control signal AE which is used to enable row address buffers (not shown in FIG. 3) is generated from the delay circuit D3. The dummy row address buffer 51 receives one of row address signals Ai and generates its true and complementary buffered signals Xi, $\overline{X_i}$ when enabled by AE. The signals Xi, $\overline{X_i}$ are applied to the NOR gate 53, the inverter $IV_3$ and the delay circuit D4 in cascade and, an internal signal $\phi_2$ is generated when the states of Xi and $\overline{X_i}$ are established. The internal signals $\phi_1$ and $\phi_2$ are applied to the NAND gate 54 for generation of $RA'$ and $TG$, as illustrated.

Figure 6:
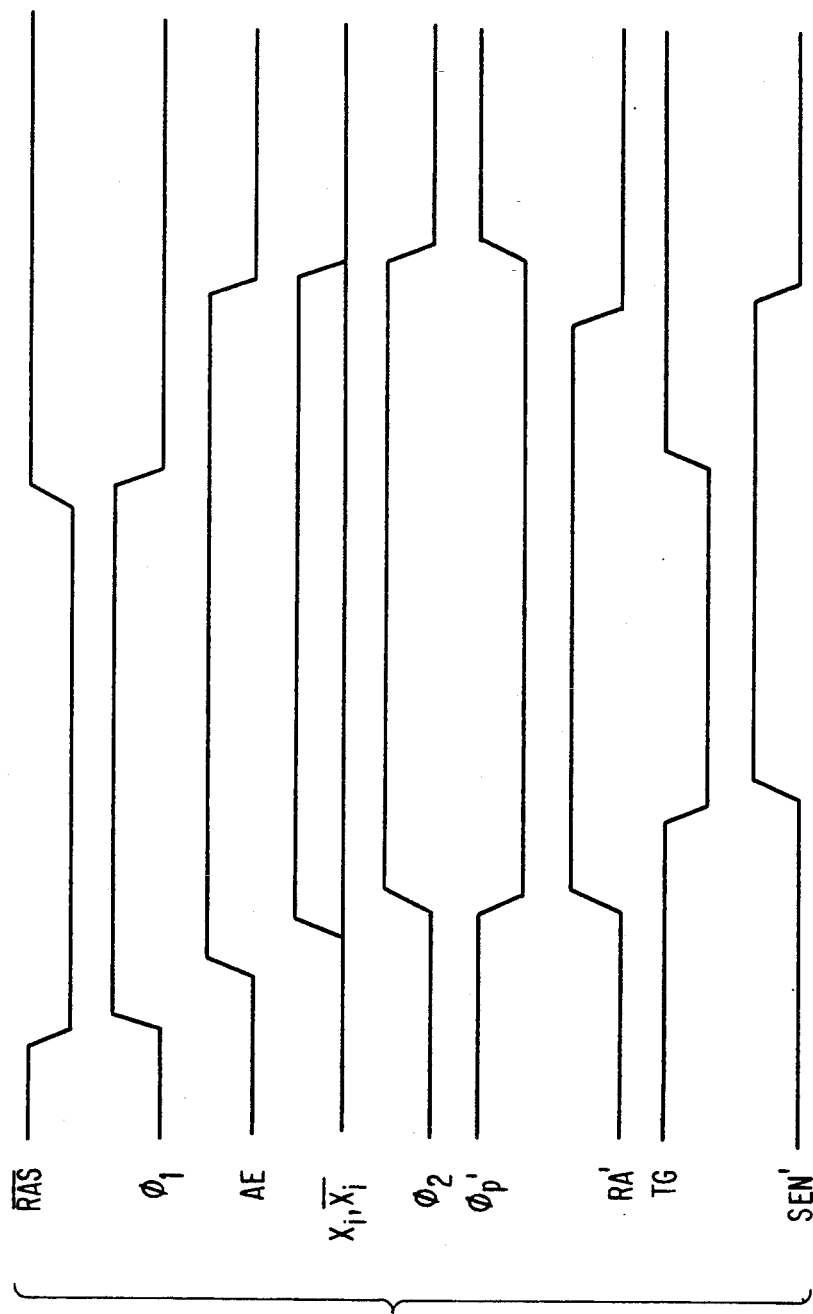
FIG. 6 is a timing diagram showing waveforms of signals in the timing signal generator of FIG. 5.

Internal waveforms of the respective signals are shown in FIG. 6.

Figure 7:
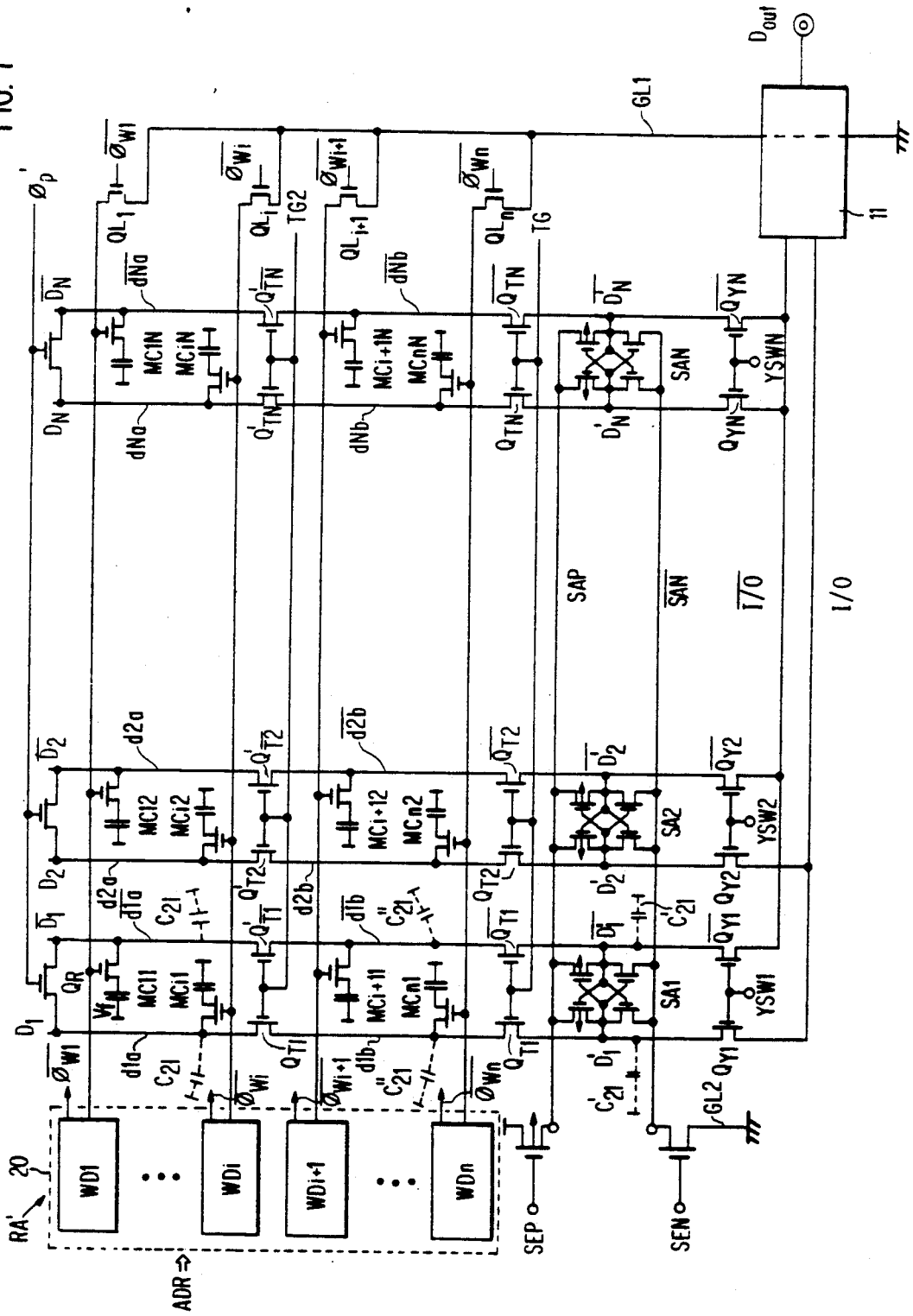
FIG. 7 is a schematic circuit diagram of a dynamic memory according to a second embodiment of the present invention.
Figure 8:
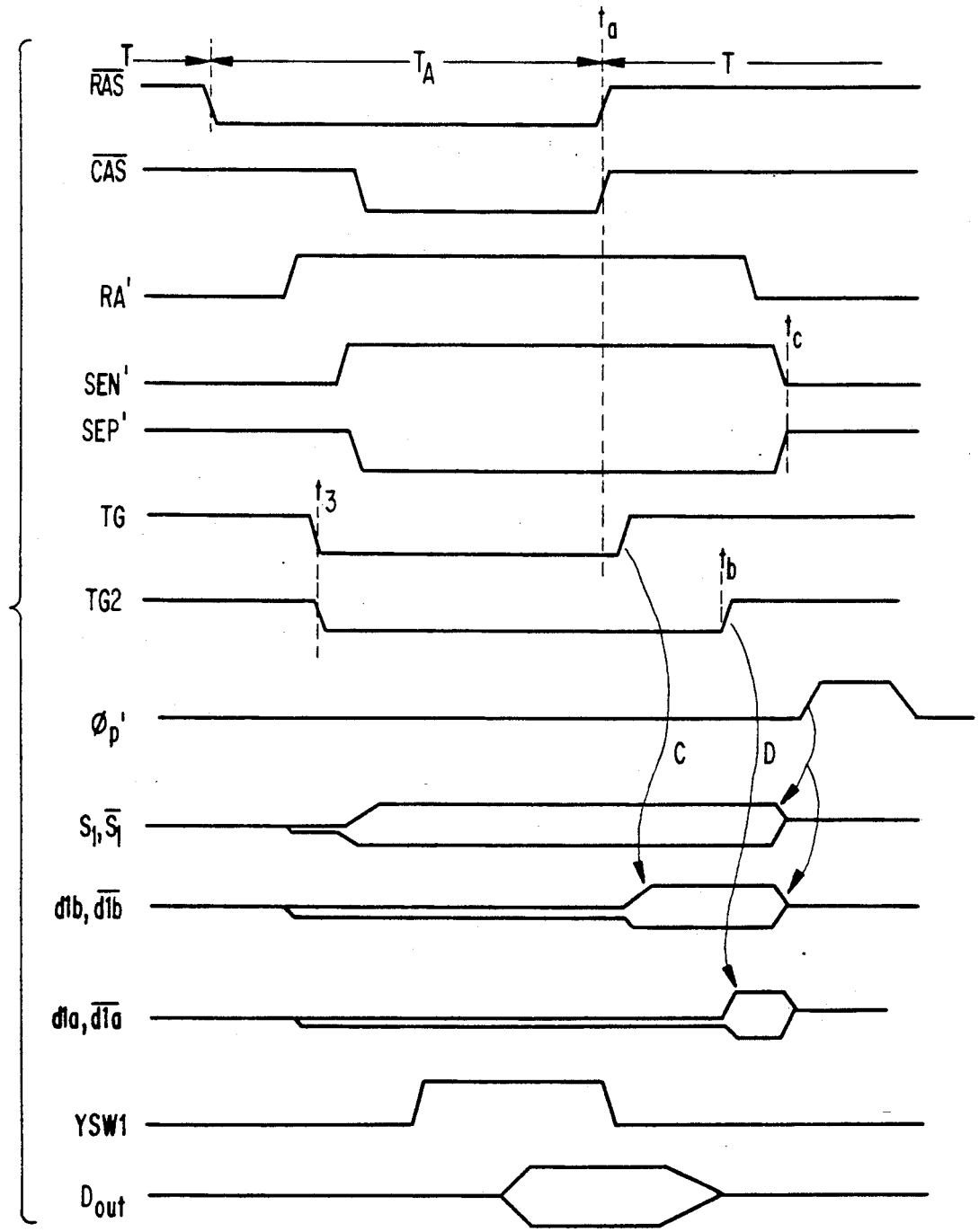
FIG. 8 is a timing diagram showing an operation of the memory of FIG. 7.

FIG. 7 shows the arrangement of a second embodiment of the present invention. This arrangement differs from the arrangement shown in FIG. 3 in that bit lines are divided into two groups $d_{1a}$, $\overline{d_{1a}}$–$d_{Na}$, $\overline{d_{Na}}$ and $d_{1b}$, $\overline{d_{1b}}$–$d_{Nb}$, $\overline{d_{Nb}}$, which are separated from each other through second transfer gates $Q_{T1}'$, $\overline{Q_{T1}'}$ to $Q_{TN}'$, $\overline{Q_{TN}'}$.

The operation is substantially the same as that of the foregoing first embodiment except for the following. Namely, at the time when the transfer gate control signal TG is lowered at $t_3$ in the first embodiment in the active period $T_A$, the first and second transfer gate control signals TG and TG2 of the second embodiment are lowered simultaneously or successively in the mentioned order and thereafter both maintained at the low potential during the active period $T_A$ to maintain the bit lines $d_{1a}$, $\overline{d_{1a}}$ to $d_{Na}$, $\overline{d_{Na}}$ and $d_{1b}$, $\overline{d_{1b}}$ to $d_{Nb}$, $\overline{d_{Nb}}$ near the middle potential. In the reset period TP2 introduced by the fall of $\overline{RAS}$ at $t_a$, the control signal TG is raised and the control signal TG2 is raised with a little delay at $t_b$. In other words, the feature of the second embodiment resides in that the bit lines are divided and charged or discharged in a time division manner at the time of refreshing. Thus, it is possible to reduce the generation of noise.

As has been described above, according to the present invention, after the information stored in a memory cell has been transferred to the sense nodes during the active period, the sense nodes and the bit lines are cut off from each other so as to maintain the bit line potential near the middle potential between the power supply potential and the ground potential, thereby making it possible to prevent destruction of the information stored in non-selected memory cells due to floating or sinking of the non-selected word lines caused by the ground potential line noise in the chip that is attendant on the operations of other circuit blocks on the same chip, for example, the $\overline{CAS}$ circuit block, column address buffer and column address decoder circuit, during the active period.

Further, since the margin with respect to the subthreshold current of the MOS transistors of the memory cells increases, the allowance for variations in manufacture is made. It therefore possible to expect an increase in the production yield and it also becomes possible to shorten the channel and lower the threshold voltage of the MOS transistors of the memory cells. Thus, it is possible to reduce the size of memory cells and hence the overall size of the chip and improve the performance as a result of achievement of high-speed operation.

What is claimed is:

1. A semiconductor memory circuit, comprising: means for receiving a control signal which assumes a first level during a first period from a first time point to a second time point and a second level during he second period, a pair of bit lines, a plurality of word lines intersecting with said bit lines, a plurality of dynamic type memory cells coupled to said bit lines and said word lines, a word selection circuit for operatively selecting one of said word lines, a sense amplifier having a pair of sense nodes, said sense amplifier operatively amplifying potentials at said sense nodes to high and low voltages respectively, a pair of transfer gates coupled between said pair of bit lines and said pair of sense nodes, an equalize circuit for operatively setting said pair of bit lines at a predetermined voltage, a selective output circuit coupled to said pair of sense nodes for operatively generating an output signal, and a control circuit responsive to said control signal for controlling said word selection circuit, said pair of transfer gates, said sense amplifier, said equalizer circuit and said selective output circuit such that said equalizing circuit is disenabled first after said first time point and thereafter said word selection circuit and said pair of transfer gates are sequentially enabled and disenabled, respectively, and subsequently said sense amplifier is enabled and thereafter said selective output circuit is enabled before said second time point, and after said second time point said pair of transfer gates are enabled and thereafter said word selection circuit and said sense amplifier are disenabled and thereafter said equalize circuit is enabled.

2. The semiconductor memory circuit according to claim 1, wherein said selective output circuit includes a data output circuit having a pair of input nodes, and a column selection circuit coupled between said pair of sense nodes and said pair of input nodes.

3. The semiconductor memory circuit according to claim 2, wherein said column selection circuit is disenabled at a time point between said second time point and the enablement of said pair of transfer gates.

4. The semiconductor memory circuit according to claim 1, wherein said equalizing circuit includes a switch element coupled between aid pair of bit lines.

5. The memory circuit according to claim 1, wherein each of said memory cells comprises a storage capacitor and a transfer gate transistor.

6. The memory circuit according to claim 1, wherein said pair of bit lines are divided into first and second pairs of bit line segments, and a pair of switches inserted between said first and second pair of bit line segments.

7. A semiconductor memory circuit, comprising: means for receiving a control signal which assumes a first level during a first period from a first time point to a second time point and a second level during a second period, a plurality of pairs o bit lines, a plurality of word lines intersecting with said bit lines, a plurality of dynamic type memory cells coupled to said bit lines and said word lines, a word selection circuit for operatively selecting one of said word lines, a plurality of sense amplifiers each having a pair of sense nodes and operatively amplifying potentials at its sense nodes to high and low voltages respectively, a plurality of pairs of transfer gates each coupled between each pair of said bit lines and each pair of said sense nodes, a plurality of equalize circuits each for operatively setting each pair of said bit lines at a predetermined voltage, an output circuit having a pair of input ends, a column selection circuit coupled between said plurality of sense amplifiers for operatively performing an electrical connection between one of said sense amplifiers and said pair of input ends, and a control circuit responsive to said control signal for controlling said word selection circuit, said pairs of transfer gates, said sense amplifiers, aid equalize circuits and said column selection circuit such that said equalizing circuits are disenabled first after said first time point and thereafter said word selection circuit and said pairs of transfer gates are enabled and disenabled, respectively, and subsequently said sense amplifiers are enabled and thereafter said column selection circuit is enabled before said second time point, and after said second time point said pairs of transfer gates are enabled and thereafter said word selection circuit and said sense amplifiers are disenabled and thereafter said equalize circuits are enabled.

8. A semiconductor memory circuit, comprising: means for receiving a control signal which assumes a first level and a second level, a pair of bit lines, a plurality of word lines intersecting with said bit lines, a plurality of dynamic type memory cells coupled to said bit lines and said word lines, a word selection circuit for operatively selecting one of said word lines, a sense amplifier having a pair of sense nodes, said sense amplifier operatively amplifying potentials at said sense nodes to high and low voltages respectively, a pair of transfer gates coupled between said pair of bit lines and said pair of sense nodes, a selective output circuit coupled to said pair of sense nodes for operatively generating an output signal, and a control circuit responsive to said control signal for controlling said pair of transfer gates, said sense amplifier and said selective output circuit in such a manner that in response to a change of said control signal to said first level, said pair of transfer gates are turned form a conductive state to a non-conductive state following selection of one of said word lines and the output signal is generate though said sense amplifier and said selective output circuit under the non-conductive state of said transfer gates, and after change of said control signal to said second level said pair of transfer gates are turned form the nonconductive state to the conductive state thereby to transfer the first and second voltages at said pair of sense nodes to said pair of bit lines.

* * * * *

UNITED STATES PATENT AND TRADEMARK OFFICE
CERTIFICATE OF CORRECTION

PATENT NO. : 5,148,400
DATED : September 15, 1992
INVENTOR(S) : Takeo FUJII

It is certified that error appears in the above-indentified patent and that said Letters Patent is hereby corrected as shown below:

Col. 2, line 55, delete "$\overline{I}/$" and insert --$\overline{I/O}$--;

line 57, delete the 2nd occurrence of "$QY_N$" and insert --$QY_N'$--;

Col. 3, line 3, delete "$\overline{SAN}is$" and insert --$\overline{SAN}$ is--;

line 24, delete "$\overline{D_1}, D_1$" and insert $D_1, \overline{D_1}$--;

line 28, delete "$\overline{RAS}becomes$" and insert --$\overline{RAS}$ becomes-- line 33, delete "$\overline{RAS}at$" and insert --$\overline{RAS}$ at--;

line 37, delete "$\overline{D_1}, D_1$" and insert --$D_1, \overline{D_1}$--;

line 38, before "$\overline{D_N}$" insert --$D_N$--;

line 49, delete "$D_1$" and insert --$\overline{D_1}$--;

line 63, delete "$\overline{CAS}on$" and insert --$\overline{CAS}$ on--;

line 68, delete "$\overline{I}/$" and insert --$\overline{I/O}$--;

UNITED STATES PATENT AND TRADEMARK OFFICE
CERTIFICATE OF CORRECTION

PATENT NO. : 5,148,400
DATED : September 15, 1992
INVENTOR(S) : Takeo FUJII

It is certified that error appears in the above-indentified patent and that said Letters Patent is hereby corrected as shown below:

Col. 4, line 19, delete "I/" and insert $\overline{I/O}$--;

line 32, delete the second occurrence of "$D_1$" and insert --$\overline{D_1}$--;

line 34, delete "$\overline{RAS}$is" and insert --$\overline{RAS}$ is--;

line 54, delete "$\overline{RAS}$is" and insert --$\overline{RAS}$ is--;

line 56, delete "$\overline{CAS}$and" and insert --$\overline{CAS}$ and--;

Col. 5, line 1, delete "$\overline{D_N}$" and insert --$\overline{D_N}$--;

line 9, delete "$\overline{RAS}$and" and insert --$\overline{RAS}$ and--;

lines 12 and 13, delete "$\overline{CAS}$and" and insert --$\overline{CAS}$ and--;

line 15, delete "$\overline{RAS}$is" and insert --$\overline{RAS}$ is--;

line 21, delete "$D_1$, $D_1$ - $\overline{D_N}$, $\overline{N_N}$" and insert --$D_1$, $\overline{D_1}$ - $D_N$, $\overline{D_N}$--;

UNITED STATES PATENT AND TRADEMARK OFFICE
CERTIFICATE OF CORRECTION

PATENT NO. : 5,148,400
DATED : September 15, 1992
INVENTOR(S) : Takeo FUJII

Page 3 of 4

It is certified that error appears in the above-indentified patent and that said Letters Patent is hereby corrected as shown below:

line 22, delete "$D_1$" and insert --$D_1'$--;

line 24, delete "$\overline{RAS}$becomes" insert --$\overline{RAS}$ becomes--;

line 30, delete "$\overline{RAS}$rises" and insert --$\overline{RAS}$ rises--;

line 41, delete "$\overline{D_N'}$" and insert --$\overline{D_N'}$--;

line 45, delete "$\overline{D_N'}$" and insert --$D_N'$--;

line 50, delete "$D_1'$" and insert --$\overline{D_1'}$--;

line 53, delete "$\overline{CAS}$becomes" insert --$\overline{CAS}$ becomes--;

line 53, delete "$T_5$on" and insert --$t_5$ on--;

line 58, delete "$\overline{I}/$" and insert --$\overline{I/O}$--.

Col. 6, line 3, delete "$\overline{RAS}$and" and insert --$\overline{RAS}$ and--;

line 8, delete "$\overline{I}/$" and insert --$\overline{I/O}$--;

line 12, after "$\overline{D_N}$" insert --reaches--;

UNITED STATES PATENT AND TRADEMARK OFFICE
CERTIFICATE OF CORRECTION

PATENT NO. : 5,148,400
DATED : September 15, 1992
INVENTOR(S) : Takeo FUJII

It is certified that error appears in the above-indentified patent and that said Letters Patent is hereby corrected as shown below:

line 53, delete "$\overline{RAS}$through" insert --$\overline{RAS}$ through--;

line 60, delete "$\overline{Xi}$when" and insert --$\overline{Xi}$ when--;

line 61, delete "$\overline{Xi}$are" and insert --$\overline{Xi}$ are--;

line 64, delete "$\overline{Xi}$are" and insert --$\overline{Xi}$ are--;

Col. 7, line 37, delete "$\overline{CAS}$circuit" insert --$\overline{CAS}$ circuit--.

Col. 8, line 37, delete "o" and insert --of--.

Col. 10, line 5, delete "generate" and insert --generated--.

Signed and Sealed this

Fourth Day of January, 1994

Attest:

BRUCE LEHMAN

Attesting Officer

Commissioner of Patents and Trademarks